(12) United States Patent
Kim

(10) Patent No.: US 6,828,599 B2
(45) Date of Patent: Dec. 7, 2004

(54) SEMICONDUCTOR LIGHT-EMITTING DIODE

(75) Inventor: Chang Tae Kim, Gyounggi-do (KR)

(73) Assignee: EpiValley Co., Ltd., Gyounggi-Do (KR)

( * ) Notice: Subject to any disclaimer, the term of this patent is extended or adjusted under 35 U.S.C. 154(b) by 0 days.

(21) Appl. No.: 10/381,988

(22) PCT Filed: Oct. 5, 2001

(86) PCT No.: PCT/KR01/01671

§ 371 (c)(1),
(2), (4) Date: Jun. 12, 2003

(87) PCT Pub. No.: WO02/29907

PCT Pub. Date: Apr. 11, 2002

(65) Prior Publication Data

US 2004/0041161 A1 Mar. 4, 2004

(30) Foreign Application Priority Data

Oct. 5, 2000 (KR) ......................................... 2000/58637

(51) Int. Cl.[7] .......................... H01L 23/58; H01L 23/29; H01L 21/28; H01S 5/00
(52) U.S. Cl. ............................ 257/103; 257/96; 257/94; 257/99; 438/605; 372/44; 372/50
(58) Field of Search ................................. 257/799, 773, 257/99, 615, 745; 438/605; 372/44, 50

(56) References Cited

U.S. PATENT DOCUMENTS

| | | | | |
|---|---|---|---|---|
| 5,696,359 A | * | 12/1997 | Marcus et al. | 181/199 |
| 5,977,566 A | * | 11/1999 | Okazaki et al. | 257/99 |
| 6,100,586 A | * | 8/2000 | Chen et al. | 257/745 |
| 6,541,800 B2 | * | 4/2003 | Barnett et al. | 257/98 |
| 6,580,099 B2 | * | 6/2003 | Nakamura et al. | 257/103 |
| 6,614,056 B1 | * | 9/2003 | Tarsa et al. | 257/91 |
| 6,614,170 B2 | * | 9/2003 | Wang et al. | 313/498 |

* cited by examiner

Primary Examiner—Long Pham
Assistant Examiner—Shrinivas Rao
(74) Attorney, Agent, or Firm—Merchant & Gould P.C.

(57) ABSTRACT

The present invention relates to a semiconductor LED device comprising a pumping layer with high light emitting efficiency and an active layer with smaller bandgap converting the absorbed light into any kinds of light of wavelength as required, which generates light from the AlGaInN pumping layer containing less In, projects the rays of light on the active layer containing more In, lets the required light of wavelength emit and decreases the blue shift caused by electric current, thereby increasing the light emitting efficiency and emitting lights with more than two wavelengths from one Led device. This invention enables to obtain various light of wavelength from one device and form the element through only one epitaxy process, thereby increasing reproductivity, yield, and efficiency by not using the fluorescent materials lowering the efficiency when forming white light.

6 Claims, 7 Drawing Sheets

SEMICONDUCTOR LIGHT-EMITTING DIODE

BACKGROUND OF THE INVENTION

1. Field of the Invention

The present invention generally relates to a semiconductor LED (light emitting diode) device, and, in particular, to an AlGaInN-based LED device which may produce multilights with different wavelengths and therefore emit white light by mixing those lights.

2. Description of the Background Art

Generally, switching devices such as a metal semiconductor field effect transistor and a high electron mobility transistor HEMT, and light devices such as a semiconductor laser or a light emitting diode, are used as compound semiconductor devices.

A semiconductor laser has a smaller driving current and size than those of other lasers. The semiconductor laser can directly transform the intensity and frequency of light according to variation of current. The semiconductor laser has some advantages in that it usually has high efficiency of more than 70%, and has a wide wavelength range. As a result, the semiconductor laser is widely used as optical communication appliances, office appliances such as a laser printer or a bar-code reader, and other small-sized appliances.

FIG. 1 is a cross-sectional view illustrating a first example of the conventional LED device, wherein an insulating substrate, which is transparent, is used.

A buffer layer 11, an n-type AlGaInN layer 12, an AlGaInN active layer 13, a p-type AlGaInN layer 14 and a transparent electrode 15 are sequentially stacked on an insulating substrate 10. A p-type metal electrode 16 is formed on one side of the transparent electrode 15.

An n-type metal electrode 17 is formed on the exposed portion of the n-type AlGaInN layer 12. This exposed portion is made by removing portions of the p-type AlGaInN layer 14, the active layer 13, and the n-type AlGaInN layer 12 on the other side of the substrate 10. Thus light may be emitted into the upper and lower sides of the insulating substrate 10.

FIG. 2 is a cross-sectional view illustrating a second example of the conventional LED device, wherein a conductive semiconductor substrate is used.

A buffer layer 21, an n-type AlGaInN layer 22, an AlGaInN active layer 23 and a p-type AlGaInN layer 24 are sequentially stacked on one side of a conductive semiconductor substrate 20 such as Si or SiC. A p-type metal electrode 26 is formed on the upper surface of the p-type AlGaInN layer 24. An n-type metal electrode 27 is formed beneath the lower surface of the conductive semiconductor substrate 20.

As described above, in general, compound semiconductor light emitting devices have structures in which holes from the p-type metal electrode combine with electrons from the n-type metal electrode in a single/multi-layered active layer to emit light corresponding to the bandgap of material composition of the active layer. Most of the light is emitted from the p-n junction type active layer to the upper and lower surfaces of the active layer.

Generally, major characteristics of LED such as output power and wavelength of emitted light are determined by an active layer. Accordingly, a crystalline composition of the active layer is very important.

In a semiconductor device having conventional AlGaInN-based LED structure, light with only one wavelength may be emitted from the active layer, so that using fluorescent material or employing different types of LED is required to obtain various colors.

In addition, an LED package having fluorescent material in the epoxy mold shown in FIG. 3 is required to obtain white light because a light with only one wavelength is emitted from an active layer in a semiconductor device having a conventional AlGaInN-based LED structure.

An LED device 31 of FIG. 1 is mounted on an upper portion of a metal lead frame 30. Metal electrodes of the LED device are connected to the metal lead frame with a wire 32. The LED device 31 is covered with fluorescent material 33. A body 34 molded with a transparent resin is formed.

In the white light LED package, a light with a first wavelength 35 is emitted from the LED device by current supplied to the LED device. When this light excites fluorescent material, a light with a second wavelength 36 is generated by fluorescent material, and a mixed light that includes these two lights is obtained. When the colors of these two lights are complementary to each other, white light can be obtained.

For example, when a deep-blue light with 450 nm wavelength excites the fluorescent material that contains YAG, a yellow light with 590 nm wavelength can be generated. Then, by mixing these two lights, the white light LEC package may be obtained. Here, yellow wavelength tuning may be achieved by adjusting the composition of YAG fluorescent layer and adjustment of amount ratio of these two lights may be achieved by adjusting the thickness of the fluorescent layer. After that, a white light can be obtained. The white light LED package as described above can substitute a light bulb or a back light source of display device. However, while the structure and manufacturing process of the conventional white light LED package are simple, the reliability of fluorescent material is inferior to an LED device. As a result, if used for a long period, its color may fade, or its luminous efficiency may become deteriorated.

In addition, the composition adjustment of the fluorescent material and the thickness adjustment of the fluorescent layer are not so easy that the white light tuning is difficult in mass production.

SUMMARY OF THE INVENTION

To solve said problems, the present invention provides a semiconductor LED device that includes a high-power pumping layer in the device. The semiconductor LED device according to the present invention may effectively produce light with desired wavelength by the active layer absorbing the lights from the pumping layer and the absorbed light being recombined in the active layer.

In one aspect of the present invention, a semiconductor LED device comprising a substrate, a buffer layer formed on the substrate, a first n-type AlGaInN layer formed on the buffer layer; an active layer formed on the first conductive type AlGaInN layer, a second n-type AlGaInN layer formed on the active layer, a pumping layer formed on the second conductive type AlGaInN layer, a p-type AlGaInN layer formed on the pumping layer, a p-type electrode contacted with the p-type AlGaInN layer, and a n-type electrode contacted with the second n-type AlGaInN layer, wherein the pumping layer has larger bandgap than that of the active layer and emits light by recombination of electrons from the second n-type AlGaInN layer and holes from the p-type AlGaInN layer, and the active layer emits light by using light emitted from the pumping layer.

In another aspect of the present invention, a semiconductor LED device is characterized in that the active layer comprises a $Al_xGa_yIn_zN$ layer and a $Al_{x1}Ga_{y1}In_{z1}N$ layer formed on the $Al_xGa_yIn_zN$ layer with bandgap energy of the $Al_xGa_yIn_zN$ layer being smaller than bandgap energy of the $Al_{x1}Ga_{y1}In_{z1}N$ layer, and the pumping layer comprises a $Al_aGa_bIn_cN$ layer and a $Al_{a1}Ga_{b1}In_{c1}N$ layer formed on the $Al_aGa_bIn_cN$ layer with bandgap energy of the $Al_aGa_bIn_cN$ layer being smaller than bandgap energy of the $Al_{a1}Ga_{b1}In_{c1}N$ layer, wherein x+y+z=1, x1+y1+z1=1, a+b+c=1 and a1+b1+c1=1.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE INVENTION

Figure 1:
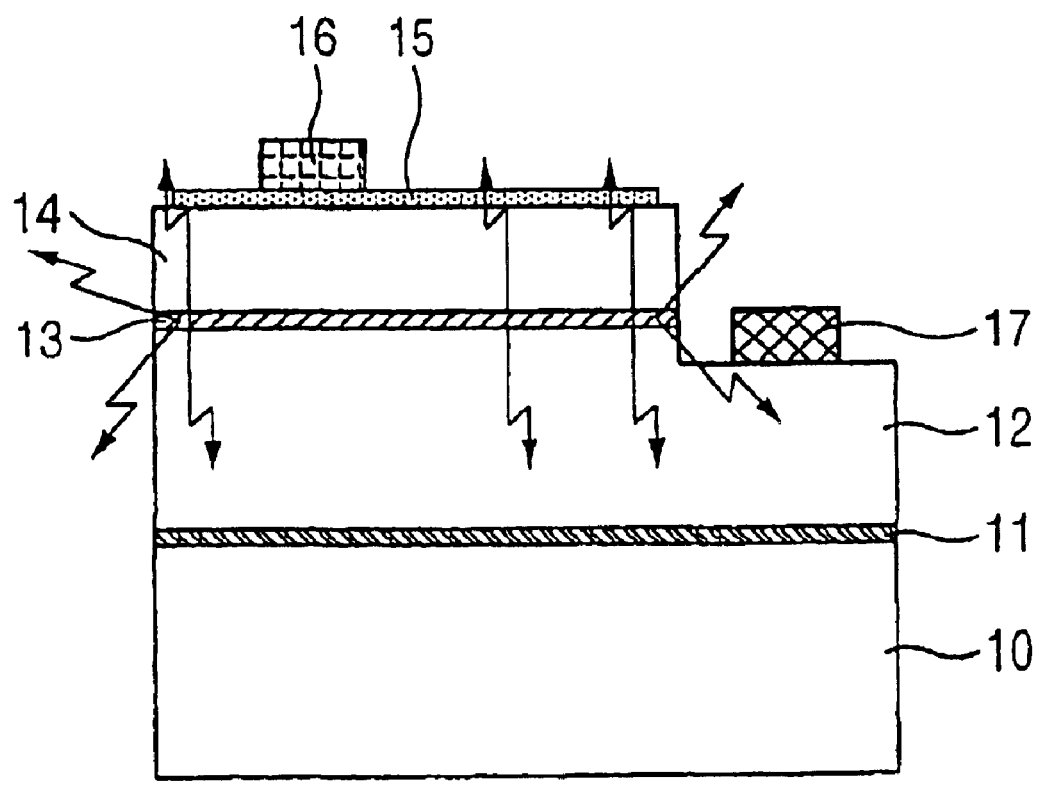
FIG. 1 is a cross-sectional view illustrating a first example of the conventional LED device.
Figure 2:
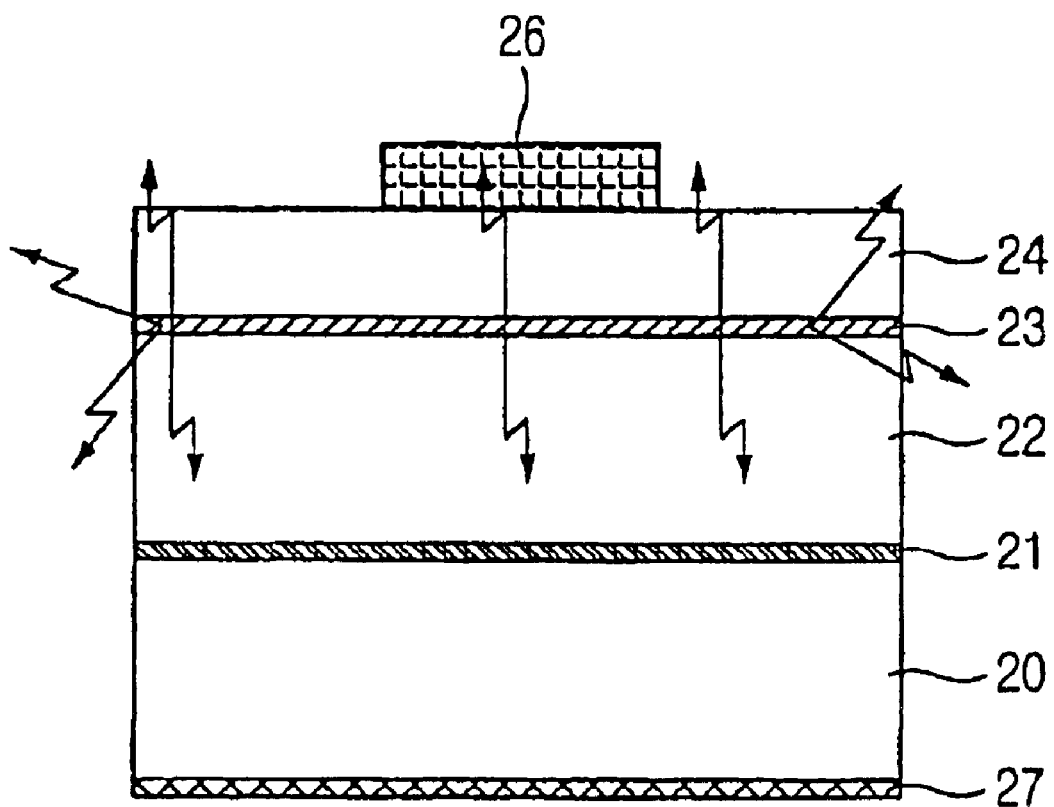
FIG. 2 is a cross-sectional view illustrating a second example of the conventional LED device.
Figure 3:
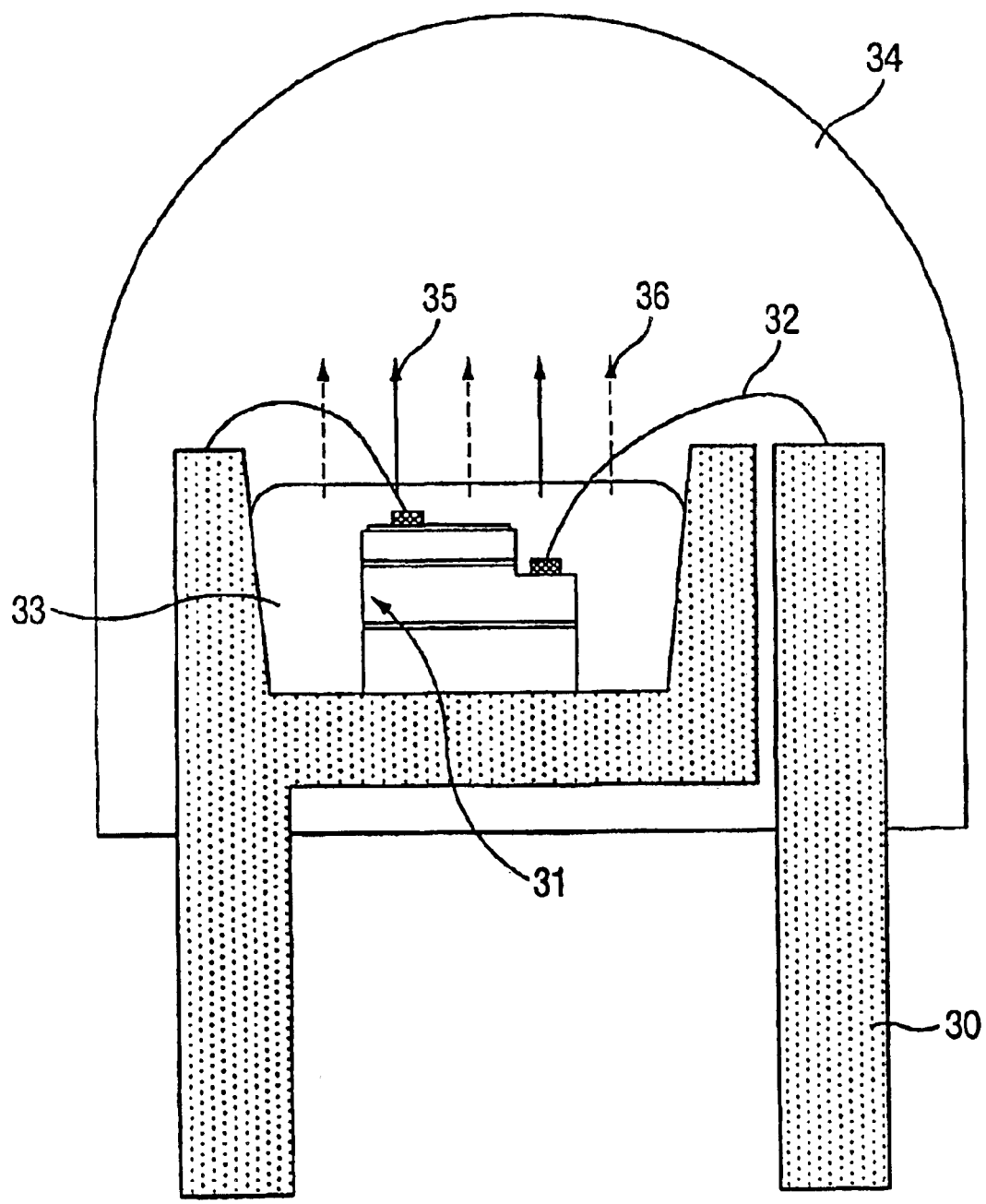
FIG. 3 is a cross-sectional view illustrating an LED package wherein the LED device of FIG. 1 is mounted.

A semiconductor LED device of the present invention will be described in detail with reference to the accompanying drawings.

Generally, the efficiency of an AlGaInN-based light device is deteriorated with the amount of In being increased in an AlGaInN layer. A light emitted from an InGaN active layer containing In of about 35% has a wavelength of about 470 nm. The output power in this case is about 3~5 mW depending on the structure of the device. On the other hand, a light emitted from an active layer containing In of about 5% or about 22% has a wavelength of 380 nm or 430 nm, respectively. In this case, output power of more than about 10 mW can be obtained even with the same structure. This is due to deterioration of the crystalline quality as the quantity of In in an active layer increases. This results in low efficiency. If the quantity of In is increased, a phenomenon of a light being transformed into a light with shorter wavelength during the process of injection of current into the active layer, i.e. the blue shift phenomenon is increased, thereby deteriorating the efficiency.

The noble structure of the present invention makes use of the advantages that the pumping layer containing small amount of In has high quality and the active layer containing large amount of In may absorb the light from the pumping layer and intactly convert that light into another light instead of emitting that another light by recombination of electrons and holes.

According to the principle described above, inefficient lights with wavelengths of 470 nm(blue), 525 nm(green) and 635 nm(red) can be easily obtained by using the pumping layer emitting high efficient lights having short wavelengths, for example, 380~430 nm.

In addition, by utilizing this principle, light having more than one wavelength can be obtained from one LED device. Lights having two or more wavelengths can be properly combined to obtain a light with new color. For example, if a deep blue light having wavelength of 450 nm generated from a pumping layer is absorbed in an active layer to generate a yellow light having wavelength of 590 nm, which corresponds to the complementary color of the deep blue, then white light can be obtained. Adjusting the thickness of the active layer and the number of the stacked layers can control the wavelength of the emitted light. Also a white light can be obtained by adjusting the amount of light absorbed in and penetrating through the active layer, which is emitted from the pumping layer.

As an alternate method, a light with two wavelengths can also be obtained by letting some of the light in the pumping layer be emitted to combine with the light from the active layer.

Since fluorescent material is not used in the above-described LED of multi-wavelengths or white light, the reliability of the device may be improved. In addition, since epitaxial wafer obtained from epitaxial growth process is applicable to the conventional blue LED manufacturing process, the manufacturing process may be simplified and a device with superior uniformity can be obtained to improve yield.

The semiconductor LED device of the present invention comprises an active layer which determines the wavelength and output power of LED, and a pumping layer which is stacked over the active layer and supplies energy to the active layer, wherein a light generated from the pumping layer is absorbed in the active layer.

Figure 4:
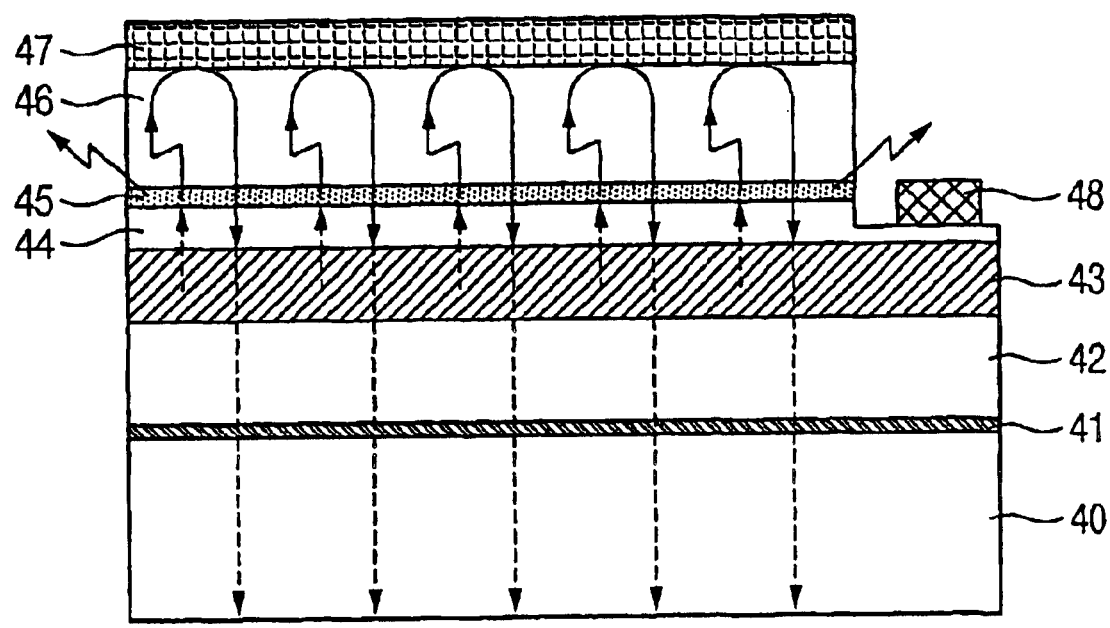
FIG. 4 is a cross-sectional view illustrating an LED device in accordance with a first preferred embodiment of the present invention.

FIG. 4 is a cross-sectional view illustrating a semiconductor LED device in accordance with the first preferred embodiment of the present invention.

Referring to FIG. 4, by using the method such as MOCVD, a buffer layer 41, an n-type $Al_{x1}Ga_{y1}In_{z1}N$ layer 42 (x1+y1+z1=1), an active layer 43 having the repeatedly stacked structure of $Al_xGa_yIn_zN$ and $Al_{x1}Ga_{y1}In_{z1}N$ layers, an n-type AlGaInN layer 44, a pumping layer 45 having the repeatedly stacked structure of $Al_aGa_bIn_cN$ and $Al_{a1}Ga_{b1}In_{c1}N$ layers, a p-type AlGaInN layer 46 and an opaque p-type metal electrode 47 are sequentially staked on transparent insulating substrate 40 consisting of alumina, sapphire or quartz. Here, the upper portion of the n-type AlGaInN layer 44 on one side of the transparent substrate 40 and the layers formed thereon are removed. An n-type metal electrode 48 is disposed on the exposed portion of the n-type AlGaInN layer 44.

Each of the active layer 43 and pumping layer 45 has the repeatedly stacked structure of two or more layers with different bandgaps, although they are shown as single layers in FIG. 4. Each of the active layer 43 and pumping layer 45 comprises repeatedly stacked multiple $Al_xGa_yIn_zN/Al_{x1}Ga_{y1}In_{z1}N$ layers and multiple $Al_aGa_bIn_cN/Al_{a1}Ga_{b1}In_{c1}N$ layers. However, they can also be formed of single layer.

The reason for employing multi-layers is to utilize the characteristics of an AlGaInN-based device such as high luminous efficiency superior to that of single layer.

Here, the active layer 43 and the pumping layer 45 satisfy the equations x+y+z=1, x1+y1+z1=1, a+b+c=1 and a1+b1+c1=1, respectively. The bandgap $Eg(Al_xGa_yIn_zN)$ of an $Al_xGa_yIn_zN$ layer included in the active layer 43 is smaller than the bandgap $Eg(Al_{x1}Ga_{y1}In_{z1}N)$ of an $Al_{x1}Ga_{y1}In_{z1}N$ layer corresponding to a barrier layer. A bandgap $Eg(Al_aGa_bIn_cN)$ of an $Al_aGa_bIn_cN$ layer included in the pumping layer 45 is smaller than a bandgap $Eg(Al_{a1}Ga_{b1}In_{c1}N)$ of an $Al_{a1}Ga_{b1}In_{c1}N$ layer corresponding to the barrier layer. The $Eg(Al_xGa_yIn_zN)$ is larger than the $Eg(Al_aGa_bIn_cN)$.

The principle of operation of the semiconductor LED device according to the present invention will be described referring to FIG. 5.

Figure 5:
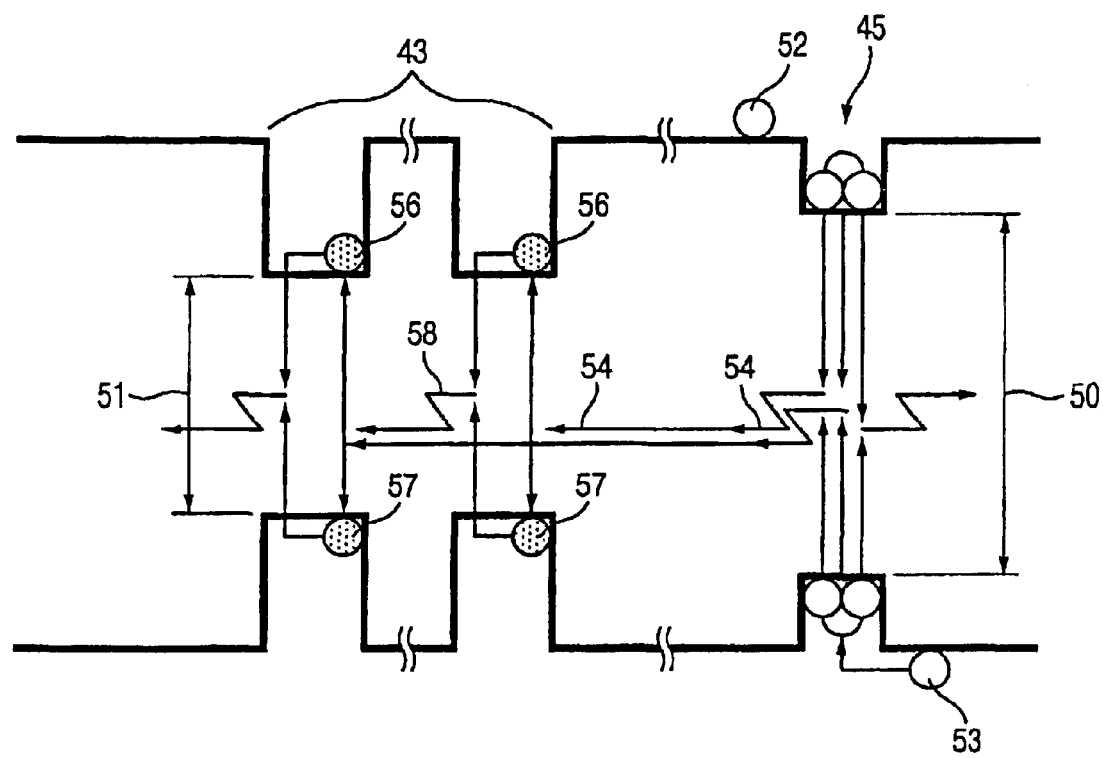
FIG. 5 is a band diagram illustrating the LED device of FIG. 4.

FIG. 5 is a band diagram illustrating the LED device of FIG. 4, wherein the barrier structures of the active layer 43 and pumping layer 45 are simplified as an AlGaInN layer, i.e. when x1=0, y1=1, z1=0, a1=0, b1=1, c1=0. The bandgap 50 of the well portion, $Eg(Al_aGa_bIn_cN)$, of the pumping layer is larger than the bandgap 51 of the well portion, $Eg(Al_xGa_yIn_zN)$, of the active layer 43.

Holes 53 provided through a p-type AlGaInN layer 46 by the current supplied from the p-type electrode and electrons 52 provided through an n-type AlGaInN layer 44 are captured in the pumping layer 45. The electrons and holes are combined in the pumping layer 45 to emit a light 54 corresponding to the bandgap Eg 50 of the pumping layer 45. The light emitted to the lower side of the pumping layer 45 is absorbed in the active layer 43. The light emitted to the upper side of the pumping layer 45 reflects from a p-type metal electrode 47 and is reabsorbed in the active layer 43. The absorbed light generates electrons 56 and holes 57. Electrons 56 and holes 57 are captured by the active layer 43 and they are recombined in the active layer 43 to emit a light 58 corresponding to the bandgap Eg 51 of the active layer. This light has the lowest energy possible in the LED structure and can be emitted entirely through the substrate without being absorbed in any layer. When the amount of Al increases the bandgap increases, while when the amount of In increases the bandgap decreases. This characteristic of bandgap may be utilized for adjusting the bandgap of the active layer 43 and pumping layer 45.

The semiconductor layers can be formed by using the methods such as MOCVD(Metal-Organic Chemical Vapor Deposition), MBE(Molecular Beam Epitaxy) or VPE(Vapor Phase Epitaxy).

Figure 6:
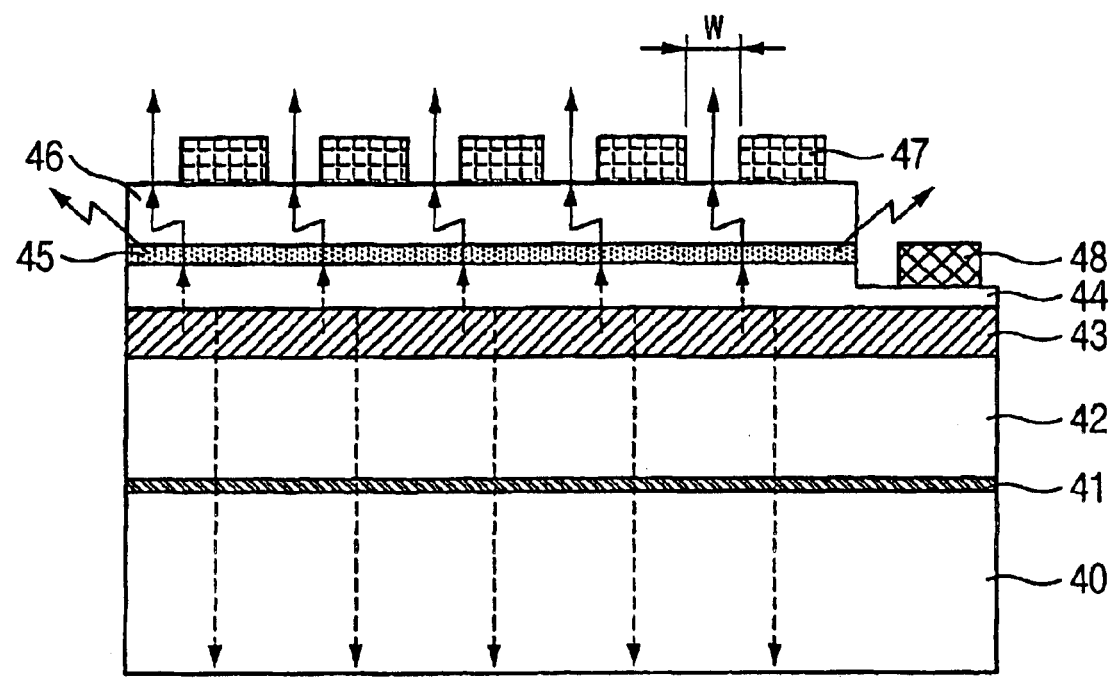
FIG. 6 is a cross-sectional view illustrating a LED device in accordance with a second preferred embodiment of the present invention.

FIG. 6 is a cross-sectional view illustrating a semiconductor LED device in accordance with the second preferred embodiment of the present invention. The semiconductor LED device has similar structure to that of the LED of FIG. 4. However, the semiconductor LED device comprises a plurality of windows for emitting light. The windows are formed by patterning some parts of the p-type metal electrode.

A transparent substrate 40, a buffer 41, an n-type AlGaInN layer 42, an active layer 43 having the repeatedly stacked structure of $Al_xGa_yIn_zN/Al_{x1}Ga_{y1}In_{z1}N$ layers, an n-type AlGaInN layer 44, a pumping layer 45 having the repeatedly stacked structure of $Al_aGa_bIn_cN/Al_{a1}Ga_{b1}In_{c1}N$ layers, a p-type AlGaInN layer 46 and a p-type metal electrode 47 are sequentially formed. The p-type metal electrode 47 is partially removed to form windows W for exposing the p-type AlGaInN layer 46 and emitting lights therethrough. An n-type metal electrode 48 is formed on one side of the n-type AlGaInN layer 44.

The semiconductor LED device of FIG. 6 can be configured to control the amount of light emitted through the windows by adjusting the size of the windows W. An open width of the window W is preferably 0~300 μm. The wavelengths of lights emitted from each side of a substrate can be differently adjusted.

A conductive substrate can be used instead of a transparent substrate. In the case of using a transparent substrate a transparent electrode may be used for a p-type electrode 47 so that a light can be emitted therethrough.

The substrates in the above embodiment are all transparent substrates such as sapphire, alumina or quartz substrates, but conductive substrates such as SiC or Si substrates can be used.

Figure 7:
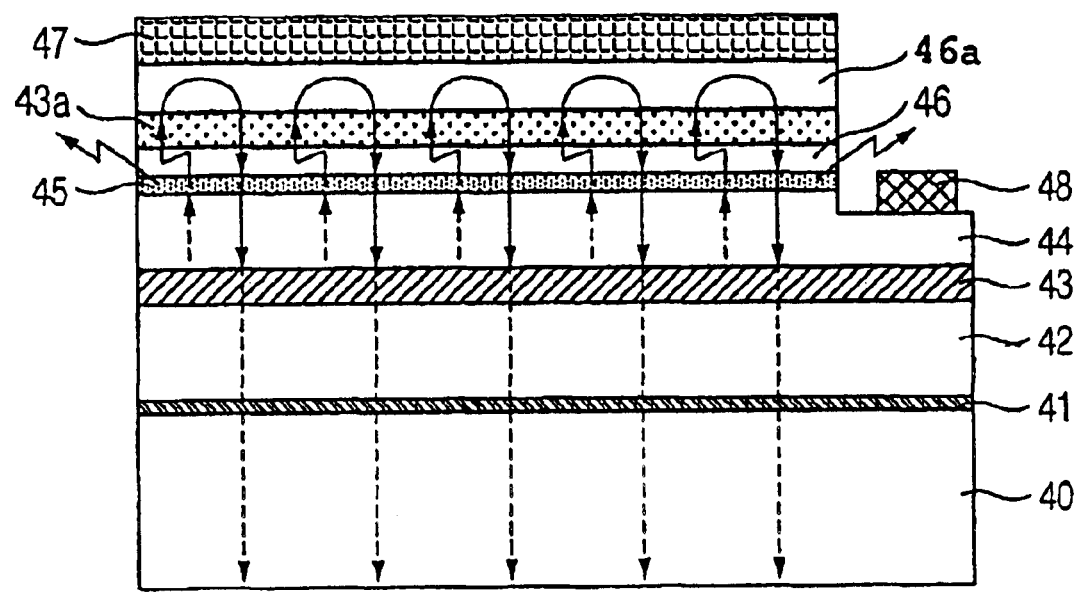
FIG. 7 is a cross-sectional view illustrating a LED device in accordance with a third preferred embodiment of the present invention.

FIG. 7 is a cross-sectional view of a semiconductor LED device in accordance with the third preferred embodiment of the present invention. The semiconductor LED device has similar structure to that of the LED of FIG. 4. However, an active layer is stacked on the upper portion of a pumping layer.

A buffer layer 41, an n-type AlGaInN layer 42, an active layer 43 having the repeatedly stacked structure of $Al_xGa_yIn_zN/Al_{x1}Ga_{y1}In_{z1}N$ layers, an n-type AlGaInN layer 44, a pumping layer 45 having the repeatedly stacked structure of $Al_aGa_bIn_cN/Al_{a1}Ga_{b1}In_{c1}N$ layers, a p-type AlGaInN layer 46, an active layer 43a, a p-type AlGaInN layer 46a and a p-type metal electrode 47 are sequentially formed On a transparent substrate 40. An n-type metal electrode 48 is formed on the n-type AlGaInN layer 44 at one side of the substrate 40.

As described above, light with multiple wavelengths or white light can be obtained from one device by adjusting the composition and thickness of the active layers 43 and 43a. Since the active layers 43 and 43a are provided over and under the pumping layer 45 to emit a light to both sides.

Also lights of different wavelengths can be emitted to both directions by forming the p-type metal electrode 47 with a transparent electrode.

As described above, a semiconductor LED device according to the present invention comprises a pumping layer with high luminous efficiency and an active layer, which comprises homo-junction multiple layers and has smaller bandgap than that of the pumping layer to transform a received light into a light of desired wavelength. Light is generated in the pumping layer consisting of AlGaInN, and then emitted into the active layer with more In than that of the pumping layer to emit a light of desired wavelength. As a result, blue shift by current can be reduced to improve luminous efficiency. Light of two or more wavelengths can be obtained from one LED device. Since the LED device is formed by using one continuous growth process, reproducibility of a device can be improved, and the yield can also be improved. Since fluorescent material that is not so efficient for producing a white light is not used, efficiency may be improved.

In addition, a mono-colored LED of single wavelength in which a light from a pumping layer is transformed into a light which has wavelength of a light from an active layer can be embodied by increasing the absorption rate in the active layer, and increasing the absorption rate in the active layer can be achieved by adjusting the thickness and the number of the active layer. It is possible to mount an LED device using bumps, so that the mounting process may be simplified.

What is claimed is:

1. A semiconductor LED device, comprising:

a substrate;

a buffer layer formed on the substrate;

a first n-type AlGaInN layer formed on the buffer layer;
an active layer formed on the first n-type AlGaInN layer;
a second n-type AlGaInN layer formed on the active layer;
a pumping layer formed on the second n-type AlGaInN layer;
a p-type AlGaInN layer formed on the pumping layer;
a p-type electrode contacted with the p-type AlGaInN layer; and
a n-type electrode contacted with the second n-type AlGaInN layer, wherein the pumping layer has larger bandgap than that of the active layer and emits light by recombination of electrons from the second n-type AlGaInN layer and holes from the p-type AlGaInN layer, and the active layer emits light by using light emitted from the pumping layer.

2. The semiconductor LED device according to claim 1, wherein the active layer comprises a $Al_xGa_yIn_zN$ layer and a $Al_{x1}Ga_{y1}In_{z1}N$ layer formed on the $Al_xGa_yIn_zN$ layer with bandgap energy of the $Al_xGa_yIn_zN$ layer being smaller than bandgap energy of the $Al_{x1}Ga_{y1}In_{z1}N$ layer, and the pumping layer comprises a $Al_aGa_bIn_cN$ layer and a $Al_{a1}Ga_{b1}In_{c1}N$ layer formed on the $Al_aGa_bIn_cN$ layer with bandgap energy of the $Al_aGa_bIn_cN$ layer being smaller than bandgap energy of the $Al_{a1}Ga_{b1}In_{c1}N$ layer, and x+y+z=1, x1+y1+z1=1, a+b+c=1 and a1+b1+c1=1.

3. The semiconductor LED device according to claim 1, wherein the substrate is made of electrically conductive material.

4. The semiconductor LED device according to claim 1, wherein a plurality of windows are formed in the p-type electrode.

5. The semiconductor LED device according to claim 4, wherein the width of the windows W is less than 300 $\mu$m.

6. The semiconductor LED device according to claim 1, further comprising a second p-type AlGaInN layer formed on the pumping layer and a second active layer formed on the second p-type AlGaInN layer.

* * * * *